(12) United States Patent
Goodbinder et al.

(10) Patent No.: US 10,179,598 B1
(45) Date of Patent: Jan. 15, 2019

(54) MOBILE CART

(71) Applicants: Harrison J. Goodbinder, Parsippany, NJ (US); Stephen A. Strauss, Parsippany, NJ (US); Sabrina Y. Strauss, Parsippany, NJ (US)

(72) Inventors: Harrison J. Goodbinder, Parsippany, NJ (US); Stephen A. Strauss, Parsippany, NJ (US); Sabrina Y. Strauss, Parsippany, NJ (US)

(*) Notice: Subject to any disclaimer, the term of this patent is extended or adjusted under 35 U.S.C. 154(b) by 0 days.

(21) Appl. No.: 15/217,656

(22) Filed: Jul. 22, 2016

(51) Int. Cl.
| | | |
|---|---|---|
| B62B 3/02 | (2006.01) | |
| B62B 3/00 | (2006.01) | |
| H05K 5/02 | (2006.01) | |
| H05K 7/18 | (2006.01) | |
| H05K 5/00 | (2006.01) | |

(52) U.S. Cl.
CPC ............ B62B 3/02 (2013.01); B62B 3/003 (2013.01); H05K 5/0086 (2013.01); H05K 5/0234 (2013.01); H05K 7/18 (2013.01); B62B 2202/56 (2013.01); B62B 2206/00 (2013.01)

(58) Field of Classification Search
None
See application file for complete search history.

(56) References Cited

U.S. PATENT DOCUMENTS

| | | | | |
|---|---|---|---|---|
| 5,913,582 A * | 6/1999 | Coonan | ................ | A47B 21/00 312/223.3 |
| 7,055,833 B2 * | 6/2006 | Wixted | ................ | B62B 3/006 280/47.34 |
| 7,152,488 B2 * | 12/2006 | Hedrich | ................ | F16M 11/08 73/849 |
| 7,325,891 B1 * | 2/2008 | Kinsley | ................ | B62B 3/10 280/47.35 |
| 7,467,801 B1 * | 12/2008 | Garduno | ................ | B62B 3/003 280/47.26 |
| 7,942,461 B2 * | 5/2011 | Cohen | ................ | G09F 21/04 296/21 |
| 8,662,605 B2 * | 3/2014 | McRorie | ................ | B62B 3/02 108/38 |
| 8,752,848 B2 * | 6/2014 | Petrick | ................ | H01R 13/465 280/47.35 |
| 8,916,991 B2 * | 12/2014 | Petrick | ................ | G06F 1/1628 307/31 |
| 2003/0111245 A1 * | 6/2003 | Haggerty | ................ | G06F 1/1632 174/50 |
| 2004/0175152 A1 * | 9/2004 | Chen | ................ | G10H 1/32 386/231 |
| 2004/0190741 A1 * | 9/2004 | Lopez | ................ | H04R 5/02 381/334 |
| 2008/0103637 A1 * | 5/2008 | Bliven | ................ | F16B 2/20 701/1 |

(Continued)

*Primary Examiner* — Xanthia C Cunningham
(74) *Attorney, Agent, or Firm* — Edwin D. Schindler

(57) ABSTRACT

A mobile cart for use in virtual reality and monitor-based multi-participant experiences, DJ configurations, karaoke and audio uses incorporating vertical supports extending from the housing, supporting fixed, pivotal or rotative booms radially extending from the housing serving as supports for equipment such as microphones, positional sensors, head mounted displays, and retractable tethers performing cable management by holding one or more equipment cables above a user's head to prevent user cable-entanglement, such as, when using head mounted displays.

10 Claims, 9 Drawing Sheets

(56) References Cited

U.S. PATENT DOCUMENTS

| | | | | |
|---|---|---|---|---|
| 2008/0255901 A1* | 10/2008 | Carroll | ............... | G06Q 30/0237 705/14.37 |
| 2009/0051544 A1* | 2/2009 | Niknejad | ................ | G06F 3/011 340/573.1 |
| 2010/0026151 A1* | 2/2010 | Melkumyan | ............. | B25H 1/02 312/249.11 |
| 2011/0068562 A1* | 3/2011 | Keffeler | ............... | A61G 12/001 280/651 |
| 2012/0306994 A1* | 12/2012 | Schwartz | ............ | G06F 19/3418 348/14.08 |
| 2014/0023221 A1* | 1/2014 | Weinstein | .............. | H04R 1/028 381/334 |
| 2015/0142429 A1* | 5/2015 | Ondeck | ................... | G10L 19/00 704/231 |
| 2016/0059794 A1* | 3/2016 | Brown | ................ | B60R 11/0217 224/404 |
| 2016/0119593 A1* | 4/2016 | Schultz | ................. | H04N 7/185 348/77 |
| 2016/0261777 A1* | 9/2016 | Choi | ................. | H04N 13/0203 |
| 2016/0266607 A1* | 9/2016 | Varsanik | ............. | G06F 1/1605 |
| 2017/0177832 A1* | 6/2017 | Caputo | ............... | G06F 19/3462 |
| 2017/0316605 A1* | 11/2017 | Herman | ............... | H04N 13/025 |
| 2017/0327139 A1* | 11/2017 | Thibault | ................... | B62B 3/02 |

* cited by examiner

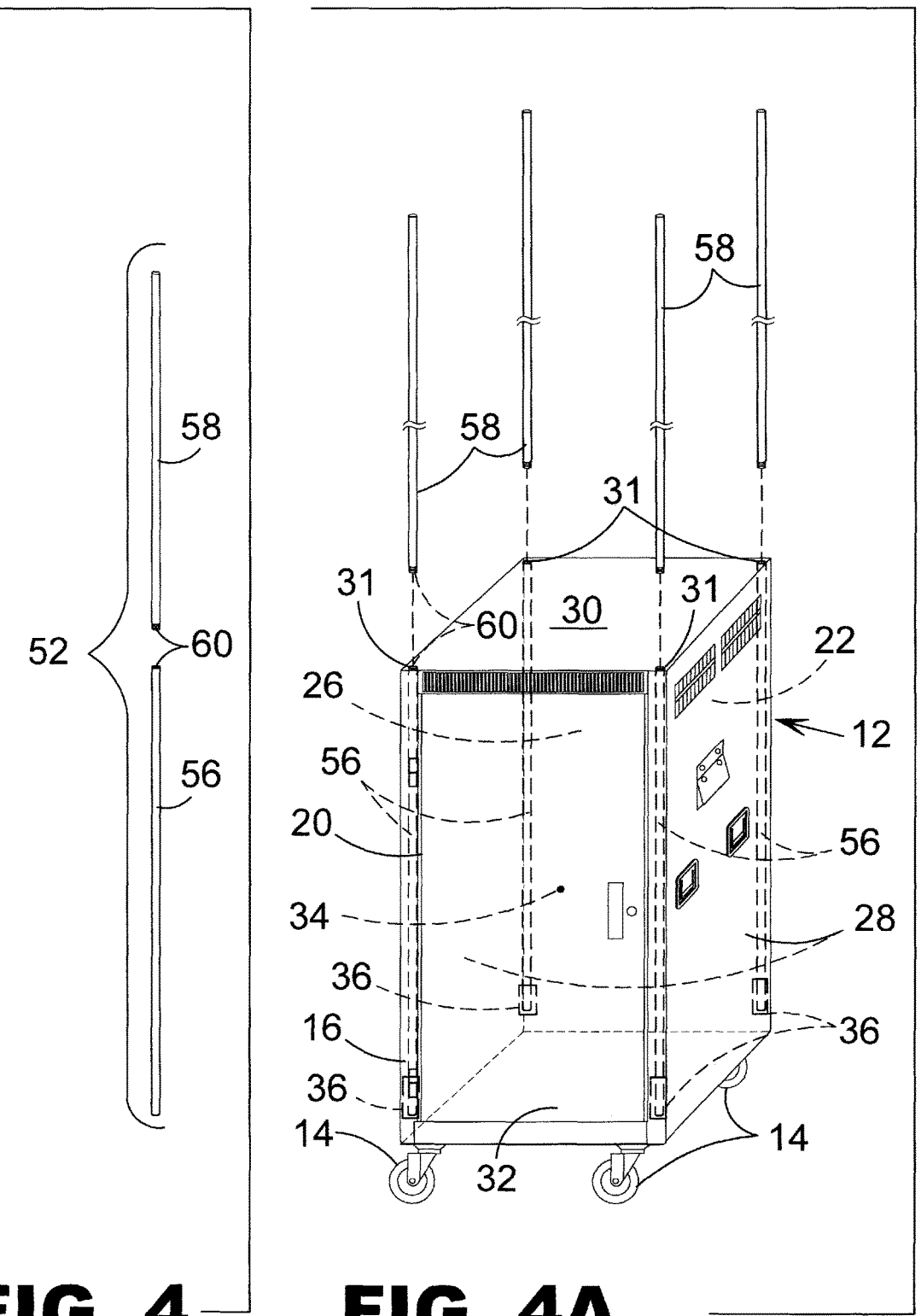
FIG. 4  FIG. 4A

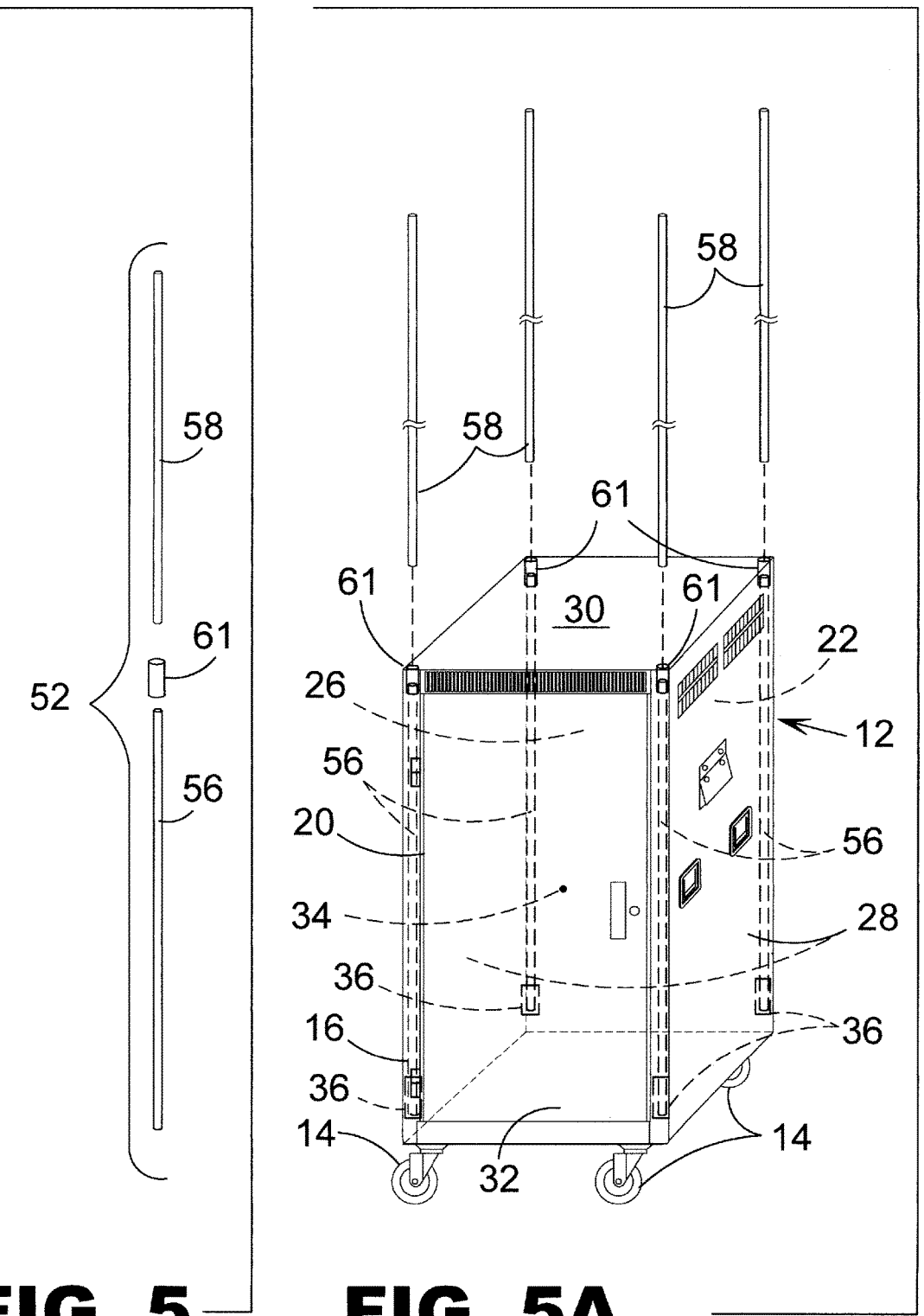
FIG. 5 FIG. 5A

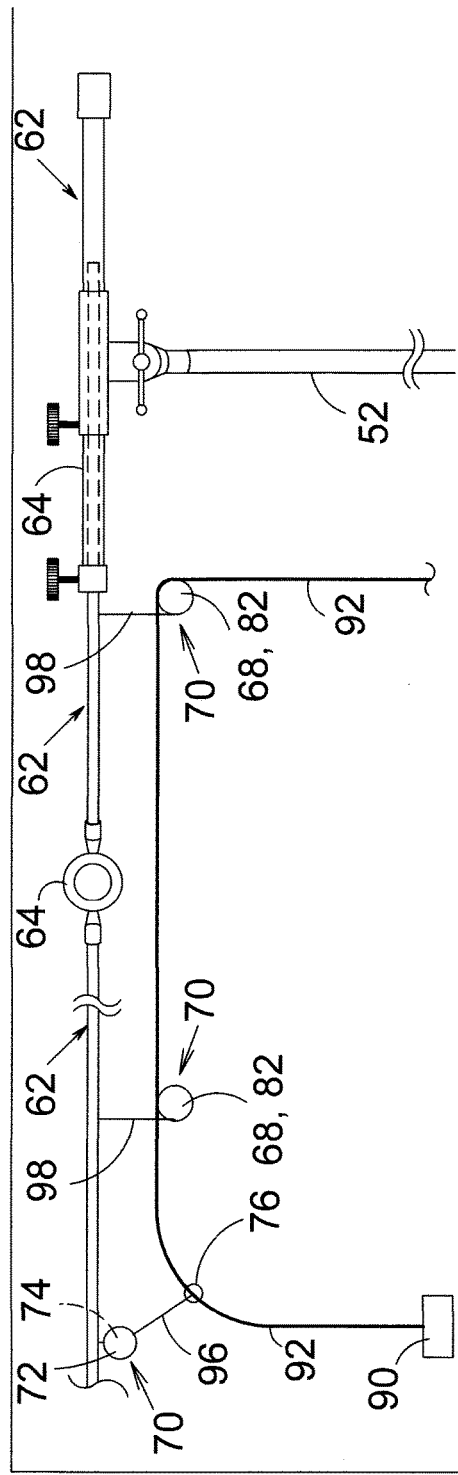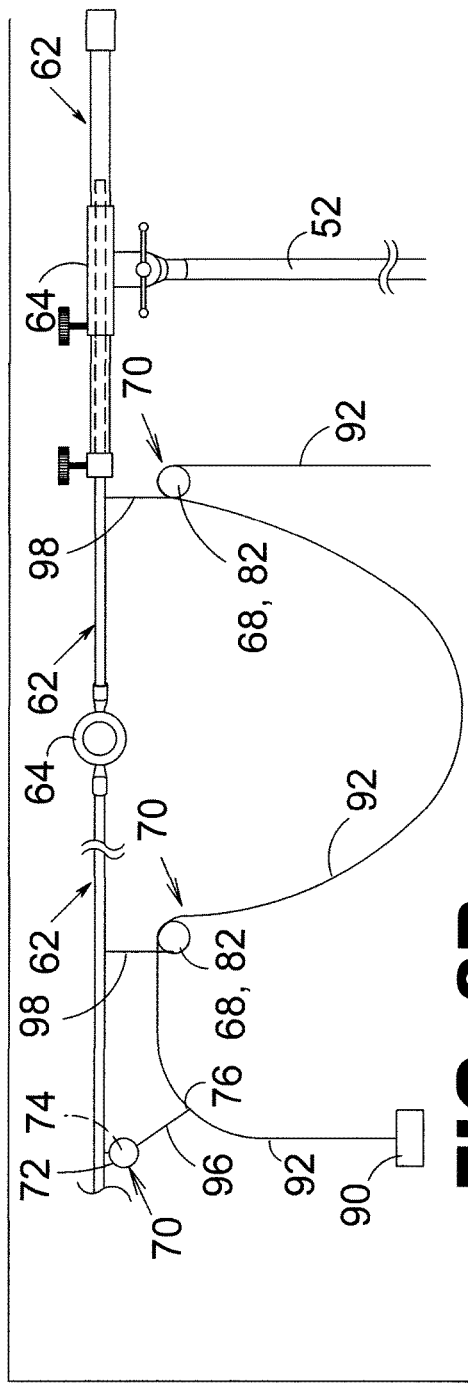

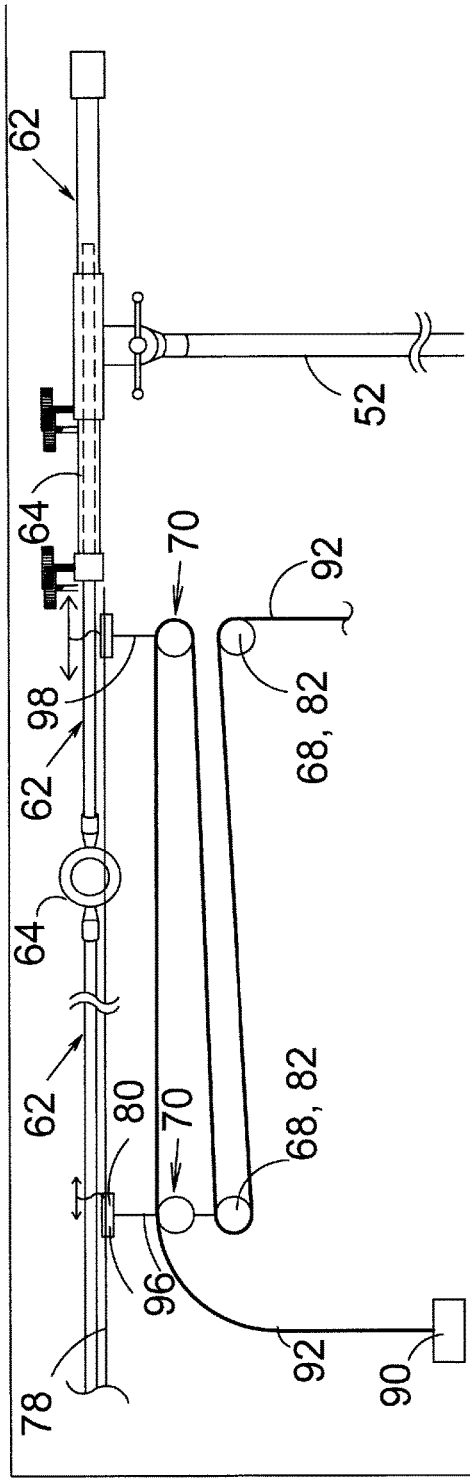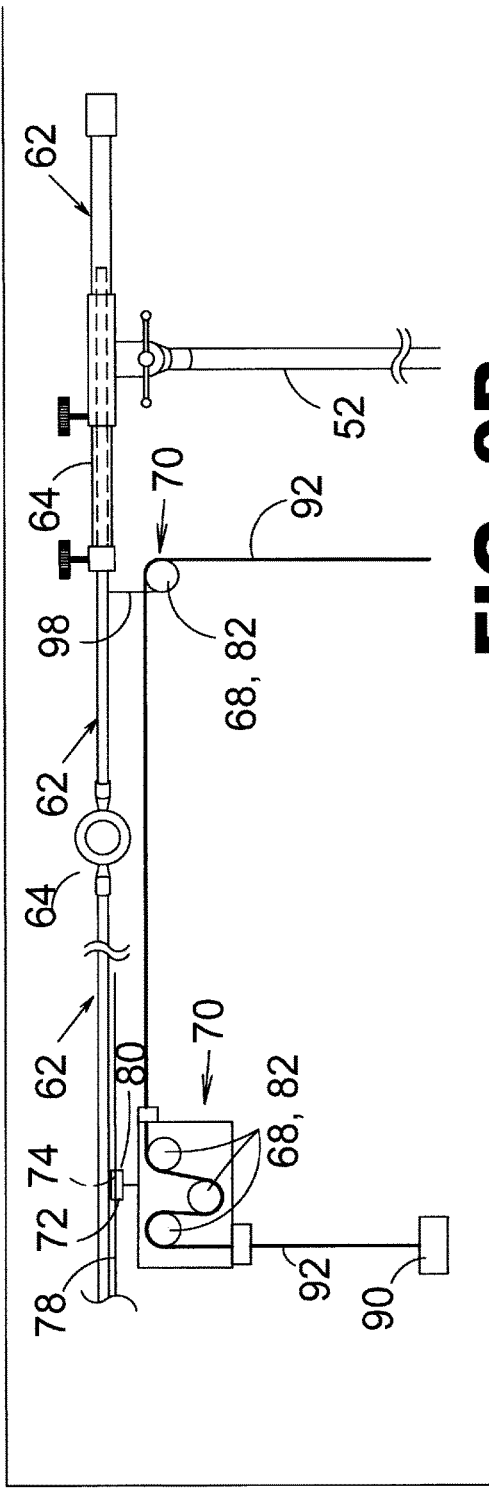
FIG. 9A
FIG. 9B

MOBILE CART

BACKGROUND OF THE INVENTION

Field of the Invention

The present invention relates generally to portable equipment and, more specifically, to a mobile cart for use in virtual reality and monitor-based multi-participant experiences, DJ configurations, karaoke and audio uses with the mobile cart providing cable management equipment for VR head sets by incorporating tensioned tethers having cable latching fasteners keeping the head set cable under sufficient tension above the users head to prevent user interference during use of a head set with the tensioned tether housing fastened to a respective head set boom and further comprising rigid support means for maintaining calibration of head sets through positional sensors by anchoring supports to the mobile cart interior or anchoring the positional sensors directly to the cart.

Description of the Prior Art

There are other mobile platforms serving industry specific applications. While these platforms may be suitable for the purposes for which they where designed, they would not be as suitable for the purposes of the present invention as heretofore described.

It is thus desirable to incorporate vertical supports extending from the housing, supporting fixed pivotal and/or rotative booms radially extending from the housing serving as supports for equipment such as microphones, positional sensors, head mounted displays, and retractable tethers performing cable management by holding equipment cable(s) above a user's head to prevent user cable-entanglement, such as, when using head mounted displays.

It is further desirable to provide a configurable mobile cart incorporating rechargeable power supply in electrical communication with an electric panel providing charging ports for portable electronic devices, converters, transformers and surge protectors for a plurality of AC and DC receptacles as power source for on-board equipment including one or more computers storing application specific software for the housed electronic equipment.

SUMMARY OF THE INVENTION

A primary object of the present invention is to provide a mobile cart for virtual reality and monitor-based multi-participant experiences, DJ configurations, karaoke and audio application uses.

An additional object of the present invention is to provide cable management for head mounted display that maintains the user's display cabling under a predetermined tension while providing un-inhibited extension and retraction of the head mounted display cabling by the user.

Another object of the present invention is to provide a mobile cart with a housing forming rigid platform having a wheel base providing extension of the rigid platform through rigid uprights as a stable base for use as a VR platform mitigating the need for recalibration of head gear with sensor through inadvertent contact with calibrating equipment causing the need for recalibration.

Yet another object of the present invention is to provide a mobile cart comprising housing having front and back walls, side walls, top and bottom walls with the housing mobility provided by a plurality of bottom wall depending wheels that may include locking mechanism to prevent casual movement.

Still yet another object of the present invention is to provide a mobile cart wherein said walls form storage receptacle for power supply, computers, controllers and ancillary equipment.

A further object of the present invention is to provide a mobile cart wherein one or more of said walls incorporate door providing access to the housing interior receptacle.

A yet further object of the present invention is to provide a mobile cart housing receptacle with rails having a plurality of spaced apart threaded apertures longitudinally extending along each rail allowing selective attachment of shelving providing customizable compartments within the housing receptacle.

A still yet further object of the present invention is to provide a mobile cart housing receptacle with a front-side pair of rails for attachment of shelving having a depth that may vary and a backside pair of rails for attachment of shelving having a predetermined depth that is greater than, equal to or less than the front-side depth and the number of shelves deployed and spacing between shelves provides for customizing the housing receptacle into first and second storage areas using selectively positionable shelving.

An additional object of the present invention is to provide a mobile cart with housing wall knockouts or cutouts for the passage of wires and cables extending between the housing interior and exterior.

Another object of the present invention is to provide a mobile cart having one or more supports vertically depending from a top side mount or from a housing receptacle anchor extending through a top wall aperture providing rigid mast-like structural vertical support for radially extending boom(s).

Yet another object of the present invention is to provide a mobile cart that mitigates recalibration of VR head sets to positional sensors that is required through unintended movement of the positional sensors relative to each other.

Still yet another object of the present invention is to provide a mobile cart where the vertical support matingly engages the boom holder housing a boom arm forming boom having one or more features including pivotal boom holder, rotative boom holder, angularly adjustable relative to the verticals, telescopic and control means for securing desired positioning.

A further object of the present invention is to provide a mobile cart where said boom holder may incorporate an articulated joint for pivoting and/or rotating the boom arm relative to the vertical support.

An object of the present invention is to provide a mobile cart where the boom arm having a distal end provides anchor means for attaching equipment including microphone(s), positional sensors, head mountable devices, etc.

A still yet further object of the present invention is to provide a mobile cart where the boom arm serves as anchor for attachment of a second boom increasing the radial length and distance between the booms terminal ends and users in a multi-user environment.

An additional object of the present invention is to provide a mobile cart where the boom arm can be rotated in a common direction serving anchor for a plurality of microphones positional over a large area.

Another object of the present invention is to provide a mobile cart wherein said vertical supports may be telescopic with fastening means for latching the vertical supports to a desired height.

Additional objects of the present invention will appear as the description proceeds.

The present invention overcomes the shortcomings of the prior art by providing a mobile cart for use in virtual reality and monitor-based multi-participant experiences, DJ configurations, karaoke and audio uses incorporating cable management through tensioned tethers holding cables above a user's head to prevent user entanglement with cables for devices such as head mounted displays.

Additionally, the present invention provides an embodiment incorporating static vertical supports to mitigate equipment recalibration caused by inadvertent movement of calibrated equipment, such as positional sensors.

Furthermore, the mobile cart incorporates configurable compartments for storage and deployment of equipment for application including D.J., karaoke and virtual reality by incorporating power source for a receptacle panel of AC, DC receptacles, converters and transformers powering a plurality of on-board electronic equipment in performance of the aforementioned applications.

The foregoing and other objects and advantages will appear from the description to follow. In the description reference is made to the accompanying drawings, which forms a part hereof, and in which is shown by way of illustration specific embodiments in which the invention may be practiced. These embodiments will be described in sufficient detail to enable those skilled in the art to practice the invention, and it is to be understood that other embodiments may be utilized and that structural changes may be made without departing from the scope of the invention. In the accompanying drawings, like reference characters designate the same or similar parts throughout the several views.

The following detailed description is, therefore, not to be taken in a limiting sense, and the scope of the present invention is best defined by the appended claims.

BRIEF DESCRIPTION OF THE DRAWING FIGURES

In order that the invention may be more fully understood, it will now be described, by way of example, with reference to the accompanying drawing in which:

FIG. 4 is a right perspective view of the mobile cart showing a segmented vertical support;

FIG. 4A is an exploded view of a segmented vertical support;

FIGS. 5 and 5A is a segmented vertical support and collar and the mobile cart incorporating a segmented vertical support collar;

FIGS. 8A and 8B depict enablements of cord management systems employed by the present invention; and, FIGS. 9A and 9B depict enablements of cord management systems employed by the present invention.

DESCRIPTION OF THE REFERENCED NUMERALS

Figure 1:
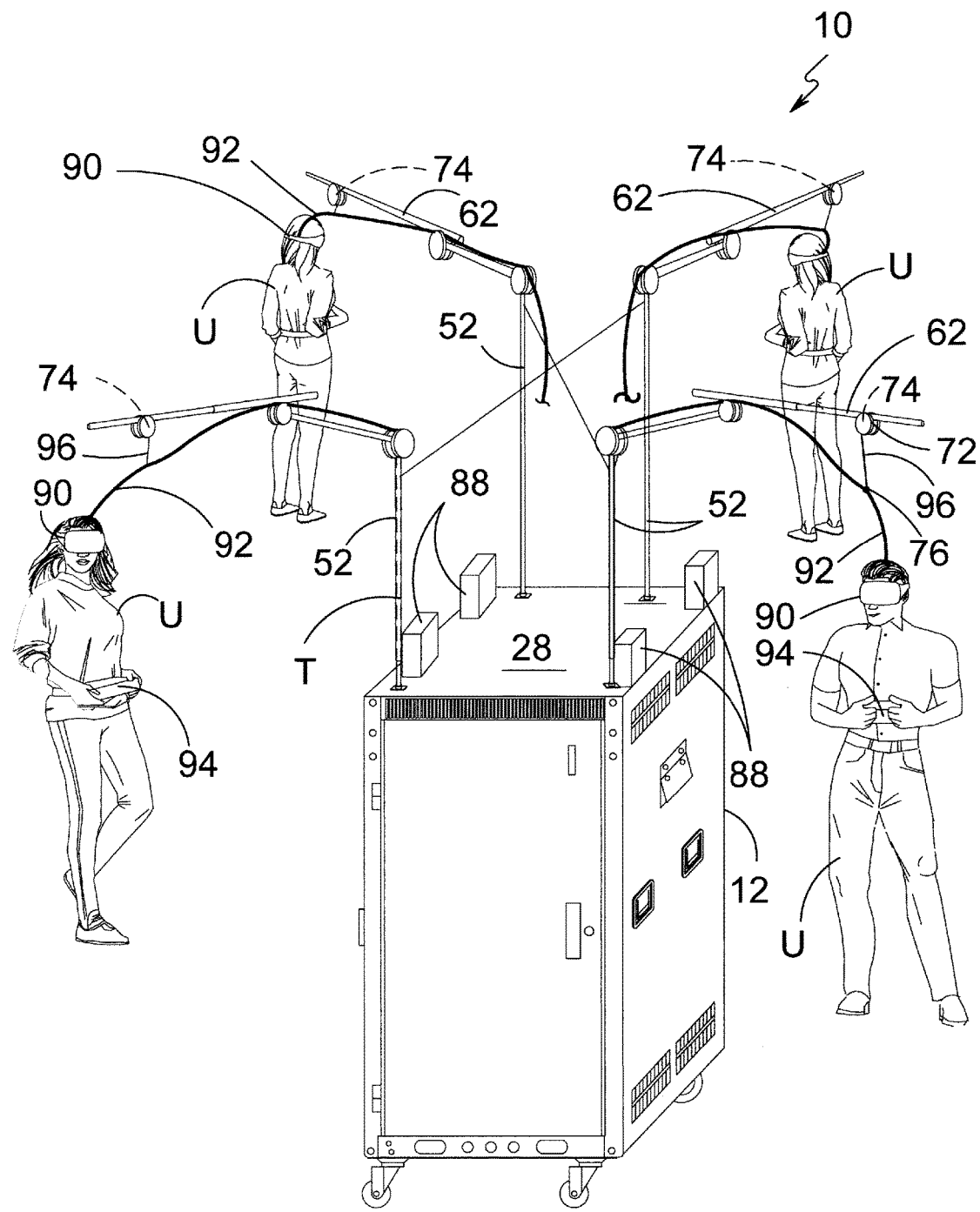
FIG. 1 is an illustrative view of an enablement of the mobile cart in use; shown is an embodiment of mobile cart 10 in use.

Turning now descriptively to the drawings, in which similar reference characters denote similar elements throughout the several views, the figures illustrate the Mobile Cart of the present invention. With regard to the reference numerals used, the following numbering is used throughout the various drawing figures:

10 mobile cart for performing virtual reality and monitor-based multi-participant experiences and audio applications
  12 housing
  14 housing wheels
  16 front wall
  20 door of 16
  22 back wall
  24 door of 22
  26 side walls
  28 top wall
  30 vertical support aperture of 28
  32 bottom wall
  34 housing receptacle
  36 housing receptacle vertical support anchors
  38 front receptacle section
  40 rear receptacle portion
  42 rails
  44 threaded aperture
  46 shelf
  48 shelf flange
  50 shelf lip
  52 vertical support
  54 vertical support mount
  56 vertical support first segment of 52
  58 vertical support second segment of 52
  60 mating fastener of 56, 58
  61 collar
  62 boom
  64 boom holder
  66 boom arm
  68 pulley
  70 tensioning device
  72 tensioned tether housing
  74 tensioning apparatus of 68
  76 tether cable-latching device of 70
  78 guideway rail
  80 housing rail interface
  82 rollers
  84 electromagnets
  86 NFC
  88 positional sensors
  90 VR head set
  92 Cable of 74
  94 controller
  96 tether
  98 fastener
  100 latching pivotal connector
  102 fastener of 100
  104 frictional engaging latching surfaces
  106 latching knob/handle
  T telescopic
  U user

DETAILED DESCRIPTION OF THE PREFERRED EMBODIMENT

The following discussion describes in detail one embodiment of the invention (and several variations of that embodiment). This discussion should not be construed, however, as limiting the invention to those particular embodiments, practitioners skilled in the art will recognize numerous other embodiments as well. For definition of the complete scope of the invention, the reader is directed to appended claims.

Referring to FIG. 1, shown is an illustrative view of an enablement of the mobile cart in use. Depicted is an enablement of a mobile cart forming rigid stable structure forming rigid base 10 serving as securement platform for rigid uprights 52 serving as rigid attachment structure for booms 62 serving as platform for a cable management system to eliminate user potential interaction with a head mounted display 90 head set cable 92 by employing a cable management system that deploys a tension tether 96 having a tether cable-latching device 76 keeping the cable above the user to a predetermined taut condition while enabling tensioned deployment of cable 92.

Also shown is the mobile cart 12 serving as mount 28 for positional sensors 88 and users U having controllers 94 calibrated to mimic user's current environment. Currently, inadvertent contact with calibrating equipment causes the need for recalibration. Booms 62 serve as arms 66 incorporating pivots 100 to provide a cantilevered arm to support cable management systems using tensioning device 70 having housing 72 for tensioning apparatus 74 having cable latching device 76 at the end of tensioned tether 96.

Figure 2:
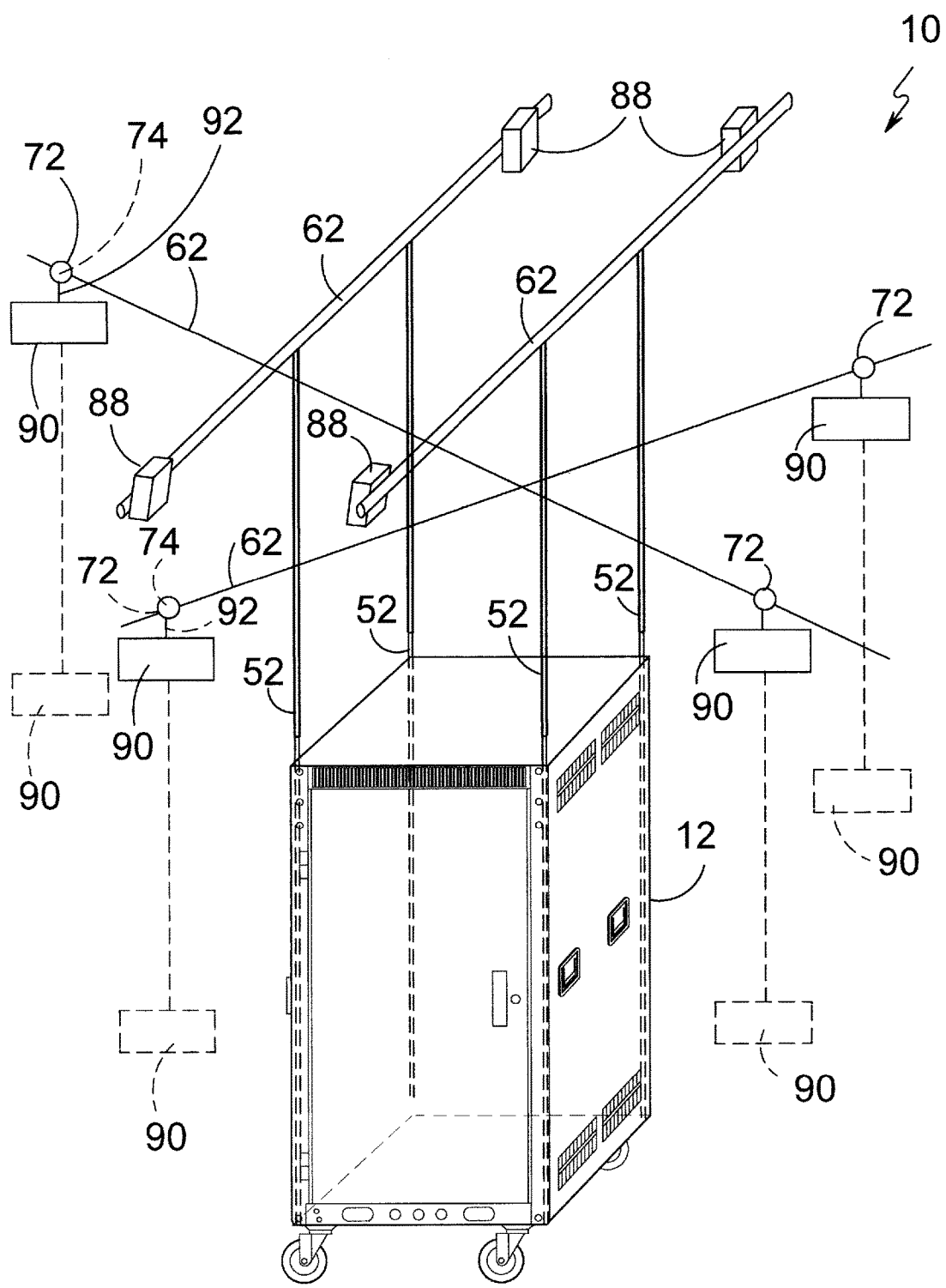
FIG. 2 is an illustrative view of an additional enablement of the mobile cart in use; shown is an embodiment of mobile cart 10.

Referring to FIG. 2, shown is an illustrative view of an additional enablement of the mobile cart. Mobile cart 10 comprises housing 12 forming rigid structure for attachment of vertical uprights 52 serving as anchor for booms supporting equipment, such as VR Head Display 90 cables 92 and boom 62 mounted sensors 88. Also shown, is an apparatus providing cable management employing tensioning devices 70 having housing 72 for tensioning apparatus 74.

Figure 3:
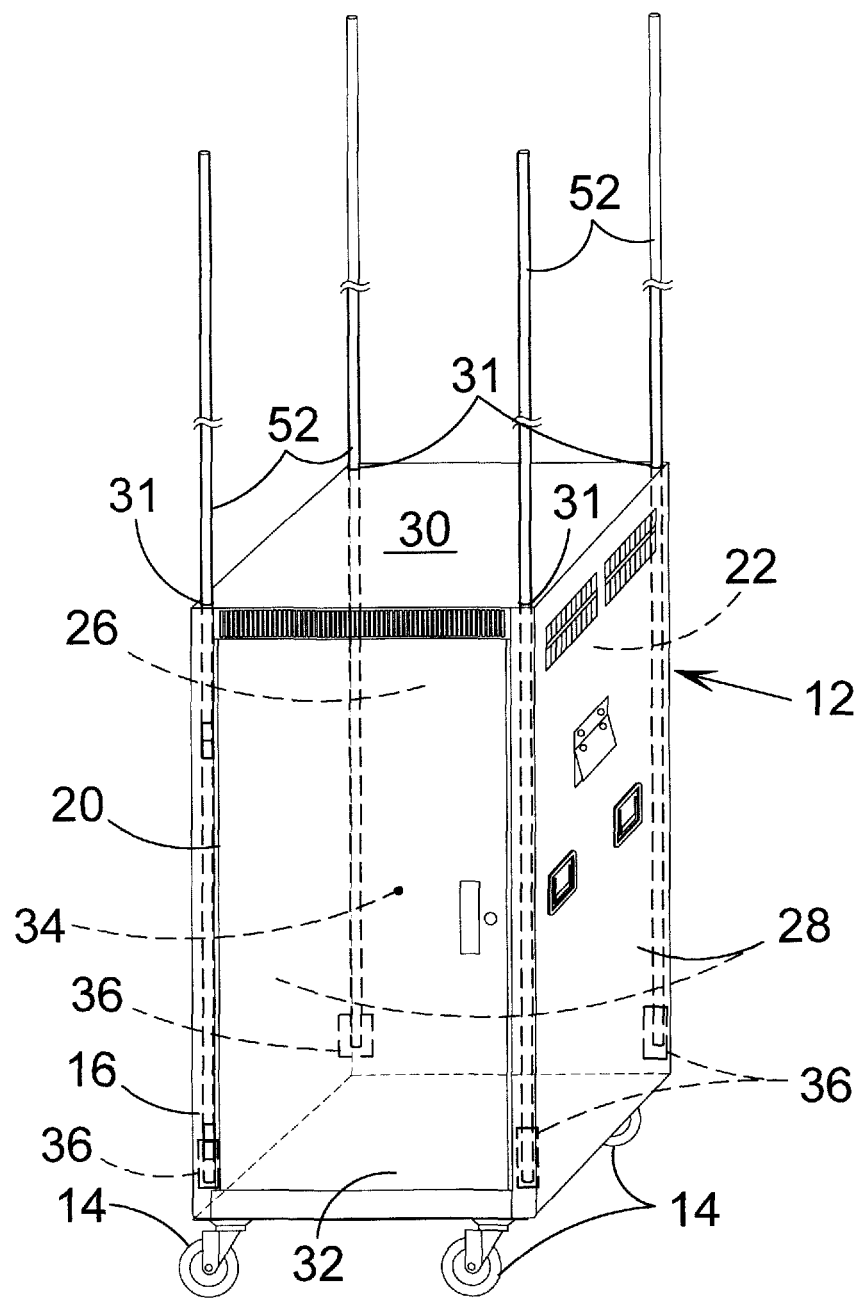
FIG. 3 is a front perspective view of the mobile cart showing a vertical support extending from a firm base within the housing receptacle through the housing top wall to a predetermined height.

Referring to FIG. 3, shown is a front perspective view of the mobile cart having vertical supports with each extending from a firm base within the housing receptacle through the housing top wall aperture to a predetermined height. The purpose of the vertical supports 52 is to extend the stability of the housing through the vertical supports 52 so that equipment once mounted thereon remains fixedly positioned until selectively repositioned, especially concerning relative calibration of one component to another. This is currently problematic in the prior art requiring recalibration of components when users bump into equipment thereby requiring recalibration of the affected equipment. The present invention provides mobile cart housing 12 comprising top wall 30, bottom wall 32, side walls 28, front wall 16 incorporating door 20 and back wall 22 having door 26 with wheels 14 providing mobility. The mobile cart housing 12 incorporates a plurality of vertical supports 52 firmly secured within housing receptacle 12 to 36 then extending through the top wall 30 through a respective aperture 31 terminating at a predetermined height.

Referring to FIGS. 4 and 4A, shown is a segmented vertical support and the mobile cart incorporating the segmented vertical support. The present invention envisions that a rigid support 52, as shown in FIG. 3, anchored to a firm base 36 can also be provided by a rigid support segment 56 terminating in a first mating fastener element 60 and a corresponding mating fastener element 60 on a distal end of support segment 58 so that the segments are lockingly engaged without any flexure play between mating fastener elements 60.

Referring to FIGS. 5 and 5A, shown is a segmented vertical support and the mobile cart incorporating a segmented vertical support collar. The rigid support 52 further provides an additional element to aid in quickly attaching and detacting a vertical support segment to the cart housing comprising a quick connect collar 61 fastened to a distal end of rigid support segment 56 with the collar's open end forming cavity for securing a distal end of support segment 58.

Figure 6A:
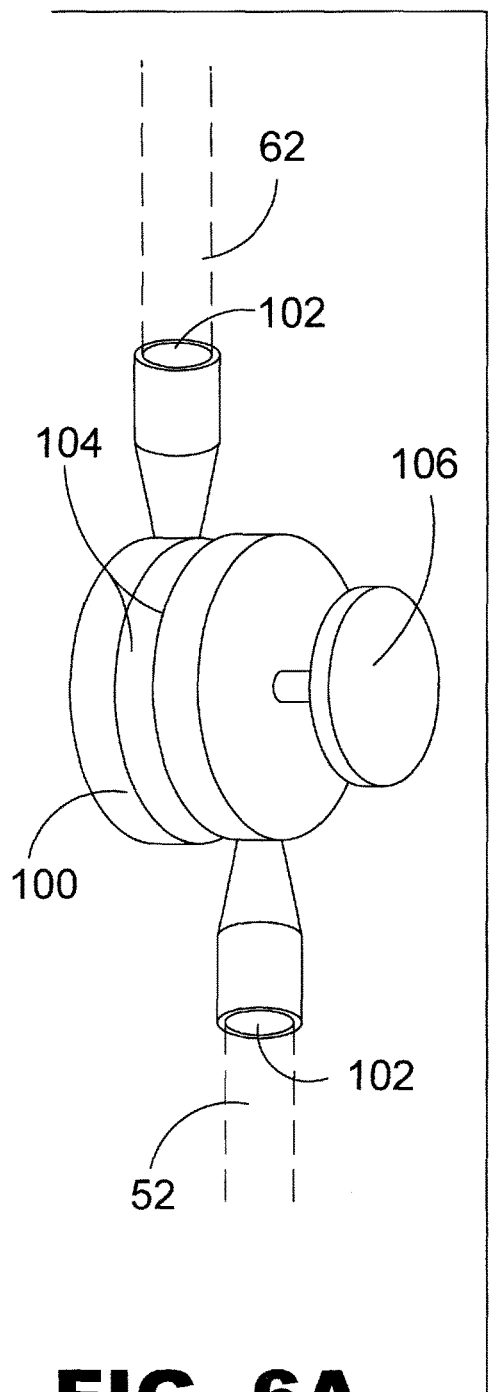
FIGS. 6A and 6B are enablements of pivotal boom holders having vertical support mounting means to the vertical's distal end and by clamp to the support body.
Figure 6B:
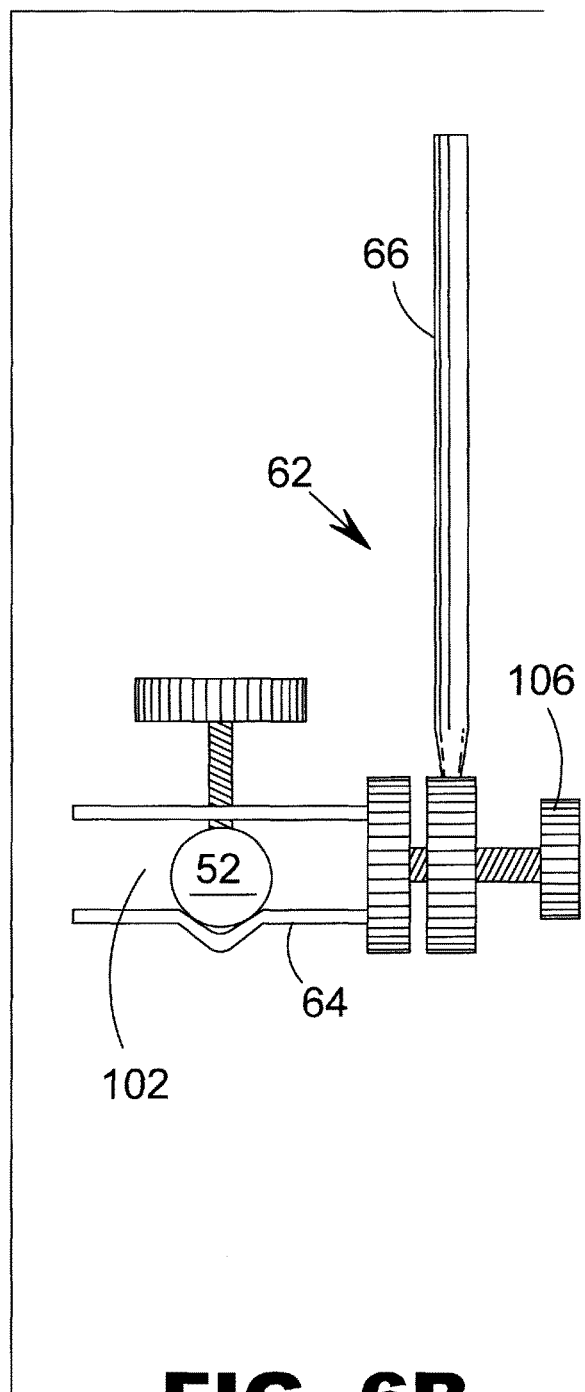

Referring to FIGS. 6A and 6B, shown are enablements of pivotal boom holders having boom receptacle engaging vertical support 52 and boom 62 attached to a second receptacle movable to a respective angle with frictional surfaces 104 latchingly engaged through handle 106. Also shown is a boom incorporating a clamp latching mechanism for securement to any portion of the vertical upright 52 through handle 106.

Figure 7:
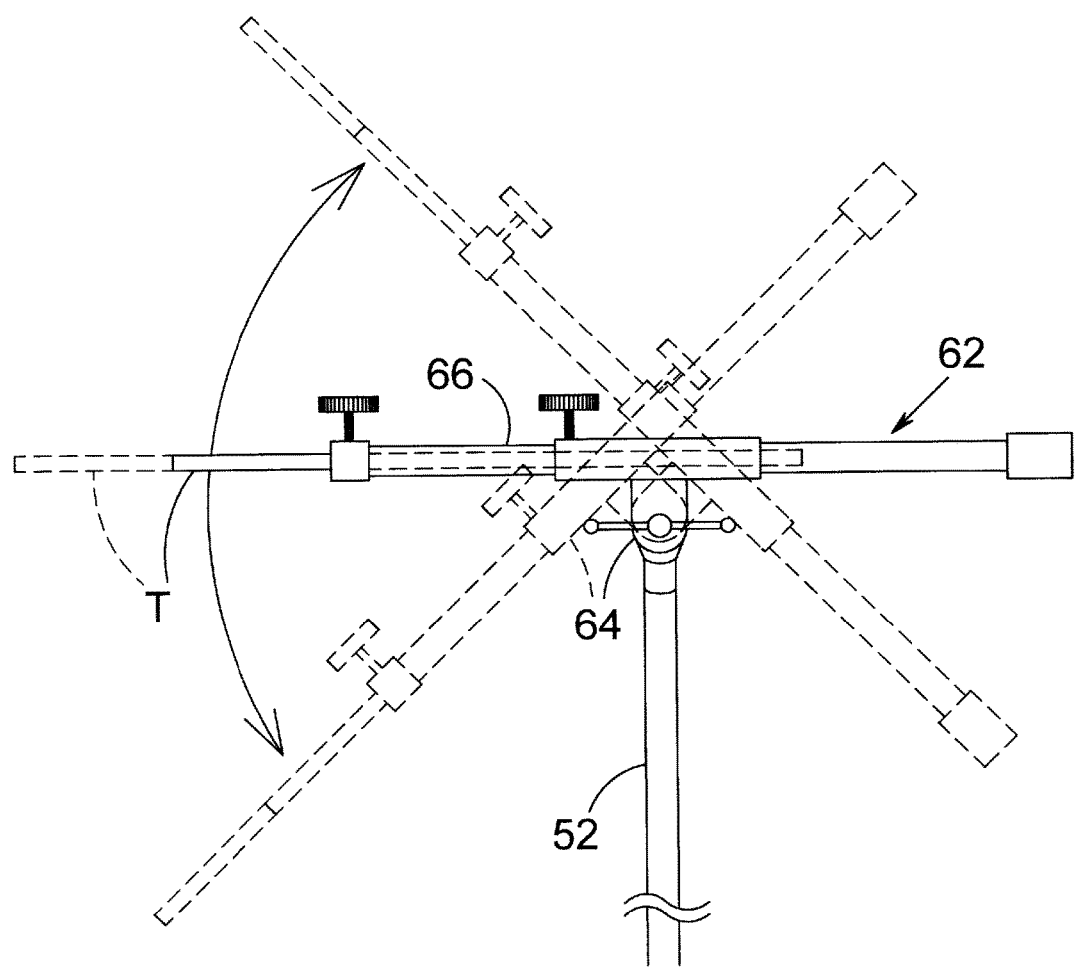
FIG. 7 is an enablement of a support mounted pivotal boom holder housing boom arm that is angularly adjustable and telescopic T.

Referring to FIG. 7, shown is an enablement of a support 52 mounted pivotal boom 62 having holder 64 housing boom arm 66 that is angularly adjustable relative to the vertical support and telescopic T.

Referring to FIGS. 8A and 8B, shown are enablements of a cable management systems where support 52 has mounted pivotal boom 62 having holder 64 comprising holder attachment receptacle and housing for boom arm 66 that is holder-angularly latchable typically through frictionally engaging surfaces and/or contoured surfaces having crest to trough structure with each lockingly engaged providing precision placement of equipment support booms.

Shown is a cable management system comprising tensioning member 70 using pulley or roller 68, 82 supporting extension and contraction of VR heat set cable 92.

Referring to FIGS. 9A and 9B shown are enablements of a cable management systems where support 52 has mounted pivotal booms 62 having holder 64 comprising holder attachment receptacle and housing for boom arm 66 supporting a rail 78 having a rail interface housing 80 movable along rail 78 through rollers 82 or electromagnets 84. FIG. 9A depicts a pair of housings 80 movable relative to each other in a cable management system maintaining a tensioned cable therebetween. FIG. 9B depicts a single unit maintaining cable tension while controllably movable into close proximity of the user.

It will be understood that each of the elements described above, or two or more together may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is:

1. A mobile cart having facilities for performing virtual reality and monitor-based multi-participant experiences including, DJ configurations, karaoke and audio applications, the mobile cart, comprising:
   a) a wheeled housing having a top and bottom wall with side walls extending therebetween forming a housing receptacle for power supply, computers and ancillary equipment;

b) wherein at least one of said walls provides door as access to said housing storage receptacle; and, c) said housing further providing vertical supports for attaching ancillary equipment thereto, said vertical supports forming an integral part of said housing and extending from support anchors within said housing receptacle through the housing top wall, the ancillary equipment either being items that are stored in the housing receptacle or items that are in addition to the items stored in the housing receptacle.

2. The mobile cart having facilities for performing virtual reality and Monitor-based multi-participant experiences including, DJ configurations, karaoke and audio applications according to claim 1, wherein said vertical supports comprise a first anchored integral segment within the housing receptacle terminating in a distal end fastener located approximate the top wall and a second segment having a fastener matingly engageable to said first integral segment.

3. The mobile cart having facilities for performing virtual reality and Monitor-based multi-participant experiences including, DJ configurations, karaoke and audio applications according to claim 2, wherein said segments mating fasteners are threadedly engageable.

4. The mobile cart having facilities for performing virtual reality and monitor-based multi-participant experiences including, DJ configurations, karaoke and audio applications according to claim 2, wherein said second segment is telescopic.

5. The mobile cart having facilities for performing virtual reality and monitor-based multi-participant experiences including, DJ configurations, karaoke and audio applications according to claim 2, wherein said supports provide mounting for one or more booms.

6. The mobile cart having facilities for performing virtual reality and Monitor-based multi-participant experiences including, DJ configurations, karaoke and audio applications according to claim 1, wherein said vertical supports are each fixedly attached to the top wall through a mount receiving a distal end of said supports.

7. The mobile cart having facilities for performing virtual reality and monitor-based multi-participant experiences including, DJ configurations, karaoke and audio applications according to claim 6, wherein said vertical support are rotative within said mount.

8. The mobile cart having facilities for performing virtual reality and monitor-based multi-participant experiences including, DJ configurations, karaoke and audio applications according to claim 1, wherein said supports provide mounting for one or more booms.

9. The mobile cart having facilities for performing virtual reality and monitor-based multi-participant experiences including, DJ configurations, karaoke and audio applications according to claim 8, wherein said booms further comprise retractable tether latchable to an electronic device cable whereby said electronic device cable remains taut during use of said electronic device.

10. A mobile cart having facilities for performing virtual reality and monitor-based multi-participant experiences including, DJ configurations, karaoke and audio applications, the mobile cart, comprising:

a) a wheeled housing having a top and bottom wall with side walls therebetween;

b) a plurality of positional sensors that work in conjunction with VR headsets and controllers; and, c) a retractable tether latchable to an electronic device cable, so that said electronic device cable is taunt during use of said electronic device.

* * * * *